United States Patent
Kim

(10) Patent No.: US 7,943,455 B2
(45) Date of Patent: May 17, 2011

(54) CMOS IMAGE SENSORS AND METHODS OF FABRICATING THE SAME

(75) Inventor: Ui-sik Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 377 days.

(21) Appl. No.: 12/149,998

(22) Filed: May 12, 2008

(65) Prior Publication Data
US 2009/0032853 A1 Feb. 5, 2009

(30) Foreign Application Priority Data
Jul. 30, 2007 (KR) .................. 10-2007-0076431

(51) Int. Cl.
*H01L 21/8238* (2006.01)
(52) U.S. Cl. .............. 438/199; 438/48; 438/73; 438/74; 438/75; 438/584; 438/638; 438/686; 438/526; 257/445; 257/223; 257/292; 257/59; 257/233; 257/446; 257/E21.642; 257/E27.133; 257/E31.057; 257/E31.001; 257/E31.085; 257/E31.24
(58) Field of Classification Search .................. 438/48, 438/73–75, 199, 584, 638, 686, 526; 257/445, 257/223, 292, 59, 233, 446, E21.642, E27.133, 257/E31.057, E31.001, E31.085, E31.124
See application file for complete search history.

(56) References Cited

U.S. PATENT DOCUMENTS

| | | | | |
|---|---|---|---|---|
| 4,373,167 A | * | 2/1983 | Yamada | 257/230 |
| 4,467,341 A | * | 8/1984 | Suzuki | 257/230 |
| 4,672,455 A | * | 6/1987 | Miyatake | 348/311 |
| 4,717,945 A | * | 1/1988 | Yusa et al. | 257/229 |
| 4,737,833 A | * | 4/1988 | Tabei | 257/440 |
| 4,912,560 A | * | 3/1990 | Osawa et al. | 348/313 |
| 4,980,735 A | * | 12/1990 | Yamawaki | 257/222 |
| 5,619,049 A | * | 4/1997 | Kim | 257/223 |
| 5,847,381 A | * | 12/1998 | Isogai | 250/208.1 |
| 5,965,875 A | * | 10/1999 | Merrill | 250/226 |
| 6,091,793 A | * | 7/2000 | Kamashita | 377/60 |
| 6,235,549 B1 | * | 5/2001 | Bawolek et al. | 438/48 |
| 6,316,814 B1 | * | 11/2001 | Nagata et al. | 257/435 |
| 6,403,998 B1 | * | 6/2002 | Inoue | 257/292 |
| 6,465,859 B1 | * | 10/2002 | Fujiwara et al. | 257/435 |
| 6,472,698 B1 | * | 10/2002 | Nakashiba | 257/222 |
| 6,617,189 B1 | * | 9/2003 | Lin et al. | 438/48 |
| 6,642,076 B1 | * | 11/2003 | Yaung et al. | 438/48 |
| 6,744,526 B2 | * | 6/2004 | McDermott et al. | 358/1.11 |
| 6,781,178 B2 | * | 8/2004 | Shizukuishi | 257/296 |
| 6,861,686 B2 | * | 3/2005 | Lee et al. | 257/291 |
| 6,903,322 B2 | * | 6/2005 | Nakashima | 250/208.1 |

(Continued)

FOREIGN PATENT DOCUMENTS

JP 08-306902 11/1996

(Continued)

*Primary Examiner* — N Drew Richards
*Assistant Examiner* — Ankush K Singal
(74) *Attorney, Agent, or Firm* — Harness, Dickey & Pierce, P.L.C.

(57) ABSTRACT

CMOS image sensors and methods of fabricating the same. The CMOS image sensors include a pixel array region having an active pixel portion and an optical block pixel portion which encloses the active pixel portion. The optical block pixel portion includes an optical block metal pattern for blocking light. The optical block metal pattern may be connected to a ground portion.

25 Claims, 9 Drawing Sheets

U.S. PATENT DOCUMENTS

| | | | |
|---|---|---|---|
| 6,995,411 B2* | 2/2006 | Yaung et al. | 257/213 |
| 7,002,231 B2* | 2/2006 | Rhodes et al. | 257/446 |
| 7,372,497 B2* | 5/2008 | Weng et al. | 348/340 |
| 7,393,715 B2* | 7/2008 | Tazoe et al. | 438/57 |
| 7,417,702 B2* | 8/2008 | Yamazaki | 349/153 |
| 7,427,740 B2* | 9/2008 | Park et al. | 250/214.1 |
| 7,446,359 B2* | 11/2008 | Lee et al. | 257/294 |
| 7,482,570 B2* | 1/2009 | Inoue et al. | 250/208.1 |
| 7,511,257 B2* | 3/2009 | Lee et al. | 250/214.1 |
| 7,521,350 B2* | 4/2009 | Kurashima et al. | 438/618 |
| 7,534,642 B2* | 5/2009 | Choi | 438/57 |
| 7,545,423 B2* | 6/2009 | Park et al. | 348/294 |
| 7,564,083 B2* | 7/2009 | Sze et al. | 257/292 |
| 7,633,106 B2* | 12/2009 | Adkisson et al. | 257/294 |
| 7,709,863 B2* | 5/2010 | Kumesawa | 257/225 |
| 7,710,477 B2* | 5/2010 | Nam et al. | 348/275 |
| 7,760,254 B2* | 7/2010 | Suzuki | 348/272 |
| 7,800,191 B2* | 9/2010 | Ohtsuki et al. | 257/432 |
| 2002/0022309 A1* | 2/2002 | Dierickx | 438/199 |
| 2002/0149718 A1* | 10/2002 | Melnik et al. | 349/110 |
| 2003/0057431 A1* | 3/2003 | Kozuka et al. | 257/99 |
| 2003/0116768 A1* | 6/2003 | Ishikawa | 257/79 |
| 2004/0002178 A1* | 1/2004 | Fasen et al. | 438/57 |
| 2004/0126934 A1* | 7/2004 | Itano et al. | 438/129 |
| 2004/0140564 A1* | 7/2004 | Lee et al. | 257/758 |
| 2005/0067640 A1* | 3/2005 | Ohkawa | 257/291 |
| 2005/0189535 A1* | 9/2005 | Hsueh et al. | 257/40 |
| 2005/0230775 A1* | 10/2005 | Watanabe et al. | 257/444 |
| 2005/0233493 A1* | 10/2005 | Augusto | 438/51 |
| 2006/0084195 A1* | 4/2006 | Lyu | 438/48 |
| 2006/0121640 A1* | 6/2006 | Kim | 438/57 |
| 2006/0132633 A1* | 6/2006 | Nam et al. | 348/308 |
| 2006/0175535 A1* | 8/2006 | Park et al. | 250/208.1 |
| 2006/0202295 A1* | 9/2006 | Wu et al. | 257/432 |
| 2006/0237629 A1* | 10/2006 | Oda | 250/208.1 |
| 2006/0278869 A1* | 12/2006 | Hioki et al. | 257/40 |
| 2007/0052051 A1* | 3/2007 | Osaka et al. | 257/440 |
| 2007/0131977 A1* | 6/2007 | Boisvert et al. | 257/233 |
| 2007/0152286 A1* | 7/2007 | Ahn | 257/414 |
| 2007/0153337 A1* | 7/2007 | Kim | 358/482 |
| 2007/0194400 A1* | 8/2007 | Yokoyama | 257/443 |
| 2007/0210395 A1* | 9/2007 | Maruyama et al. | 257/431 |
| 2008/0001179 A1* | 1/2008 | Roy | 257/228 |
| 2008/0029837 A1* | 2/2008 | Kameda et al. | 257/443 |
| 2008/0111159 A1* | 5/2008 | Gambino et al. | 257/225 |
| 2008/0129911 A1* | 6/2008 | Huang et al. | 349/44 |

FOREIGN PATENT DOCUMENTS

| | | |
|---|---|---|
| JP | 10-289994 | 10/1998 |
| JP | 2005-117018 | 4/2005 |

* cited by examiner

CMOS IMAGE SENSORS AND METHODS OF FABRICATING THE SAME

PRIORITY STATEMENT

This application claims the benefit of priority under 35 U.S.C. §119 from Korean Patent Application No. 10-2007-0076431, filed on Jul. 30, 2007, in the Korean Intellectual Property Office, the disclosure of which is incorporated herein in its entirety by reference.

BACKGROUND

1. Field

Example embodiments relate to image sensors and methods of fabricating the same. Other embodiments relate to complementary metal oxide semiconductor (CMOS) image sensors and methods of fabricating the same.

2. Description of the Related Art

An image sensor is a device that converts one dimensional or multi-dimensional optical information into electrical signals. An image sensor may be a complementary metal oxide semiconductor (CMOS). A CMOS image sensor is a device that converts an optical image into electrical signals via CMOSs corresponding to a plurality of pixels that are alternately switched on/off.

The CMOS image sensor may be easier to operate than a charge coupled device (CCD) image sensor, which is widely used. The CMOS image sensor may be implemented with various scanning methods. The CMOS image sensor allows minimization of an image device by integrating analog and digital signal processing circuits into the same chip. The CMOS image sensor may exhibit lower power consumption.

A conventional CMOS image sensor includes a pixel array region for detecting an image. The pixel array region includes a plurality of photodiodes that sense light. In the pixel array area, a dark current flows through the photodiodes due to heat energy even if light is not detected. As such, dark noise occurs, which leads to deterioration of an image detected by the CMOS image sensor.

SUMMARY

Example embodiments relate to image sensors and methods of fabricating the same. Other embodiments relate to complementary metal oxide semiconductor (CMOS) image sensors and methods of fabricating the same.

Example embodiments provide CMOS image sensors which detect dark noise and have increased dark noise characteristics.

Example embodiments also provide methods of fabricating the CMOS image sensors.

According to example embodiments, there is provided a CMOS image sensor including a pixel array region, wherein the pixel array region includes an active pixel portion and an optical block pixel portion which encloses the active pixel portion. The optical block pixel portion includes an optical block metal pattern for blocking light. The optical block metal pattern may be connected to a ground portion.

According to example embodiments, there is provided a CMOS image sensor including a pixel array region, wherein the pixel array region includes an active pixel portion which includes a photodiode for sensing light and is formed in a middle region of a semiconductor substrate, and an optical block pixel portion that encloses the active pixel portion. The optical block pixel portion includes a photodiode for determining a dark noise characteristic, and an optical block metal pattern that prevents the photodiode of the optical block pixel portion from sensing light. The optical block pixel portion of the optical block pixel portion may be grounded through connection lines formed on an upper portion of the semiconductor substrate.

The connection lines may be grounded through a ground portion formed in the semiconductor substrate on the optical block pixel portion. The ground portion may include an impurity region formed in the semiconductor substrate on the optical block pixel portion, and a well which encloses the impurity region.

According to example embodiments, there is provided a CMOS image sensor including a photodiode on a semiconductor substrate having an active pixel portion and an optical block pixel portion. A ground portion may be formed on the optical block pixel portion of the semiconductor substrate. A plug may be formed on the ground portion of the optical block pixel portion and insulated from the semiconductor substrate on which the photodiode and the ground portion are formed. A pixel array region may be formed on the optical block pixel portion. The pixel array region may include an optical block metal pattern connected to the plug.

According to example embodiments, there is provided a method of fabricating a CMOS image sensor including forming photodiodes on a semiconductor substrate including an active pixel portion and an optical block pixel portion, forming a ground portion on the optical block pixel portion that encloses the active pixel portion of the semiconductor substrate, and forming an optical block metal pattern that is connected to the ground portion on the optical block pixel portion.

The ground portion may be obtained by forming a well on the semiconductor substrate in the optical block pixel portion and forming an impurity region in the well. The optical block metal pattern may be connected to the ground portion through connection lines formed on the optical block pixel portion.

The method may include forming an interlayer insulating layer on the optical block metal pattern, and forming a pixel exposure hole to expose the active pixel portion by dry etching the interlayer insulating layer, wherein electrical charges are produced (or generated) due to plasma when the pixel exposure hole is formed. The electrical charges may be discharged to the ground portion and the semiconductor substrate through the optical block metal pattern.

According to example embodiments, there is provided a method of fabricating a CMOS image sensor including forming photodiodes on a semiconductor substrate including an active pixel portion and an optical block pixel portion. A ground portion may be formed on the semiconductor substrate in the optical block pixel portion. An insulating layer may be disposed on the photodiode and ground portion on the optical block pixel portion. A plug, which is connected to the ground portion of the optical block pixel portion, may be formed by selectively etching the insulating layer. Connection lines may be formed on the plug and the insulating layer, which are insulated by an interlayer insulating layer and connected to the plug. An optical block metal pattern may be formed on the interlayer insulating layer and the connection lines. The optical block metal pattern may be connected to the connection lines.

The ground portion may be obtained by forming a well on the semiconductor substrate in the optical block pixel portion and forming an impurity region in the well. The method may include forming a second interlayer insulating layer on the optical block metal pattern and the connection lines, and forming a pixel exposure hole to expose the active pixel portion by etching the second interlayer insulating layer, wherein electrical charges are produced due to plasma when the pixel exposure hole is formed. The electrical charges may be discharged to the ground portion and the semiconductor substrate through the optical block metal pattern.

According to example embodiments, an optical block pixel portion, which encloses an active portion for sensing light and includes an optical block metal pattern, may be formed on a pixel array region to determine a dark noise characteristic. Electrical charges, which accumulate due to plasma produced during formation of a pixel exposure hole, may be discharged to the outside through a ground portion and a semiconductor substrate, which are connected to the optical block pixel pattern. The optical block pixel portion determines the dark noise characteristic by detecting and measuring a dark current. The optical block pixel portion provides a current value, which corresponds to the dark current based on the determined dark noise characteristic, to the photodiode on the active pixel portion in order to compensate for the dark noise, preventing (or reducing) the occurrence of dark noise in an image device.

BRIEF DESCRIPTION OF THE DRAWINGS

Example embodiments will be more clearly understood from the following detailed description taken in conjunction with the accompanying drawings.

FIG. 1 is a configuration view of a CMOS image sensor according to example embodiments;

FIG. 2 is a circuit diagram of a unit pixel of the CMOS image sensor shown in FIG. 1;

FIG. 3 is a plan view of the unit pixel shown in FIG. 2 integrated on a substrate;

FIG. 4 is a plan view of a pixel array region of a CMOS image sensor according to example embodiments;

FIGS. 5 to 10 are plan views illustrating a method of forming a cell array region of a CMOS image sensor and the structure of the CMOS image sensor according to example embodiments;

FIG. 11 is a cross-sectional view illustrating how a photodiode of the optical block pixel portion is damaged if there is no ground portion during formation of the photodiode exposure hole; and FIG. 12 is a cross-sectional view illustrating how to avoid damaging the third metal wire by plasma during formation of the pixel exposure hole shown in FIG. 9.

DETAILED DESCRIPTION OF EXAMPLE EMBODIMENTS

Figure 1:
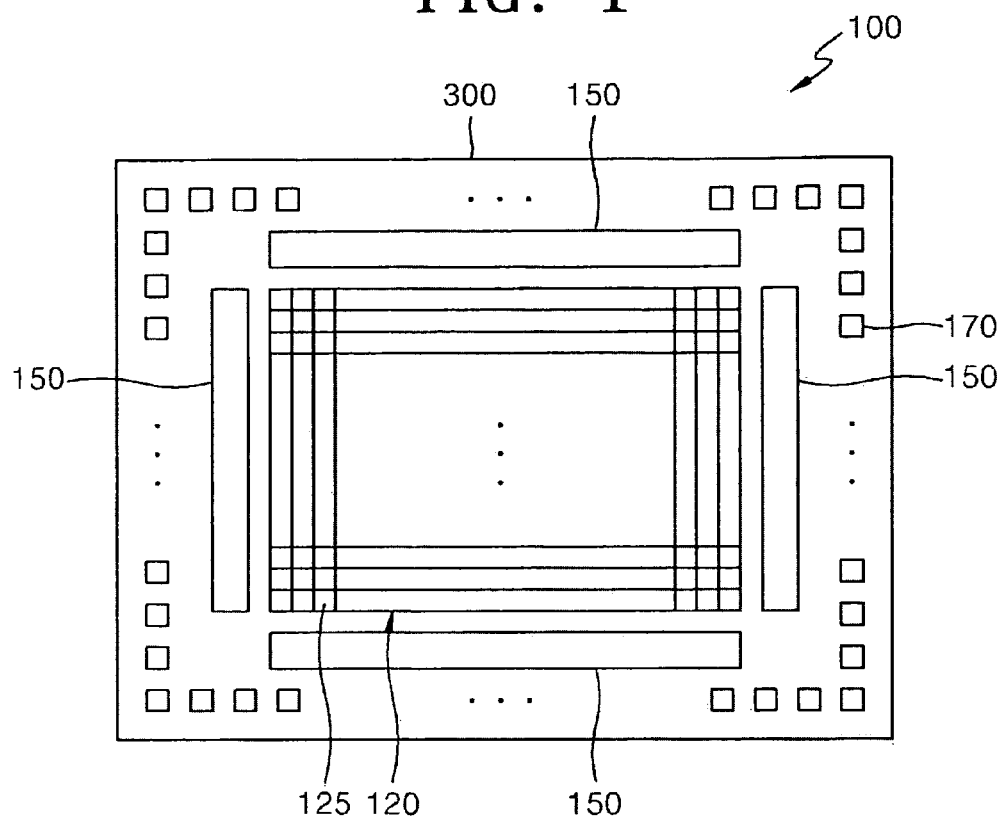
FIGS. 1-12 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to image sensors and methods of fabricating the same. Other embodiments relate to complementary metal oxide semiconductor (CMOS) image sensors and methods of fabricating the same.

In the example embodiments discussed below, the CMOS image sensors include a photodiode and four MOS transistors. However, example embodiments are not limited thereto. For example, the CMOS image sensors may include a photodiode and one, two or three MOS transistors.

Figure 2:
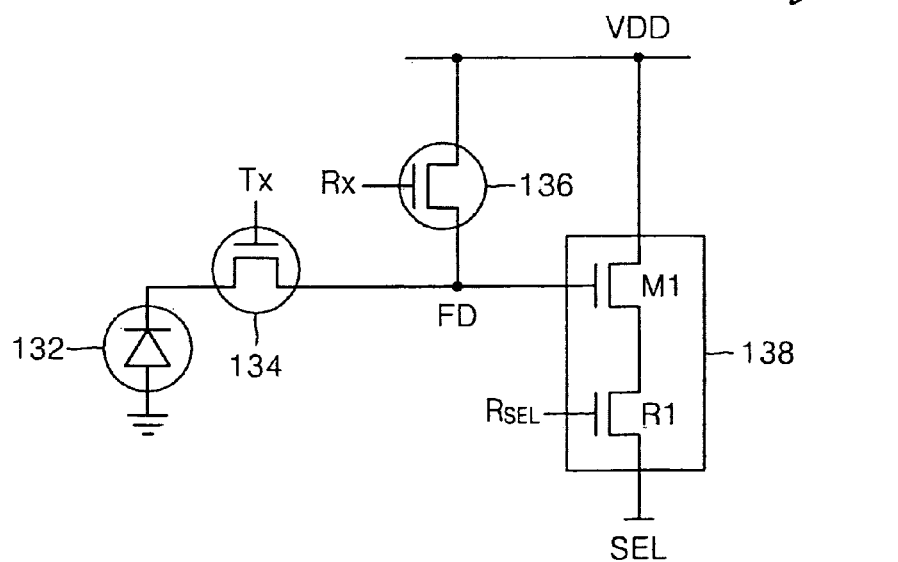
Figure 3:
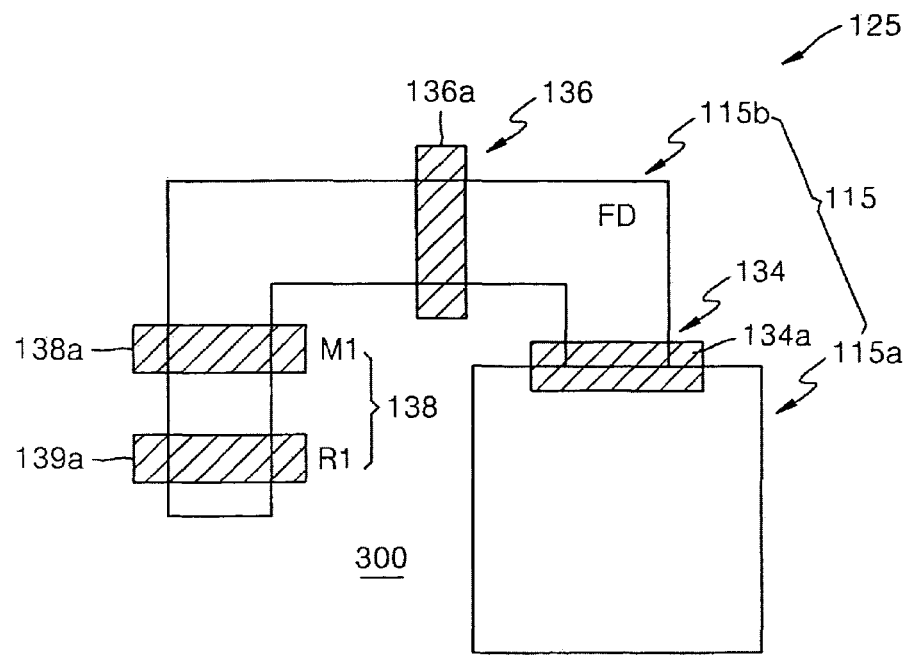

FIG. 1 is a configuration view of a CMOS image sensor 100 according to example embodiments. FIG. 2 is a circuit diagram of a unit pixel of the CMOS image sensor shown in FIG. 1. FIG. 3 is a plan view of the unit pixel shown in FIG. 2 integrated on a substrate.

The CMOS image sensor 100 in FIG. 1 includes a pixel array region 120, CMOS logic areas 150 and pads 170, which are all formed on a semiconductor substrate 300. The pixel array region 120 includes a plurality of unit pixels 125 disposed in a matrix form.

Each of the CMOS logic areas 150 may be located on a side of the pixel array region 120. The CMOS logic areas 150 may be formed of a plurality of CMOS transistors (not shown). The CMOS logic areas 150 provide a signal to each unit pixel 125 or control an output signal. Each of the pads 170 transmits and receives an electric signal from an external source or apparatus.

As shown in FIG. 2, the unit pixel 125 includes a photodiode 132 which senses light, a transfer transistor Tx 134 which transmits electrical charges generated by the photodiode 132, a reset transistor Rx 136 which regularly resets a floating diffusion region FD for storing the transmitted charges, and a source follower 138 which buffers a signal according to the charges accumulated on the floating diffusion regions FD.

The source follower 138 may be formed of two MOS transistors M1 and R1, which are connected in series. One end of each of the reset transistor 136 and the MOS transistor M1 may be connected to a supply voltage VDD. A gate electrode of the MOS transistor R1 may be connected to a row selection signal line $R_{SEL}$. The other end of the MOS transistor R1 may be connected to a column selection line SEL.

The unit pixels 125 of the pixel array region 120 may be integrated on the semiconductor substrate 300 as shown in FIG. 3. As shown in FIG. 3, an active region 115 may be formed on the semiconductor substrate 300. The active region 115 may be formed of a photodiode region 115a and a transistor region 115b. The photodiode region 115a may be, for example, square-shaped such that it occupies a particular part of the semiconductor substrate 300, which is defined as a unit pixel area.

The transistor region 115b may be formed in such a manner that at least one part of the transistor region 115b is bent and one side thereof contacts a side of the photodiode region 115a. The transistor region 115b may be, for example, line-shaped and bent-shaped. Gate electrodes 138a and 139a of source followers 138 may be formed on the transistor region 115b. A gate electrode 134a of a transfer transistor 134 and a gate electrode 136a of a reset transistor 136 may be formed on the transistor region 115b.

Figure 4:
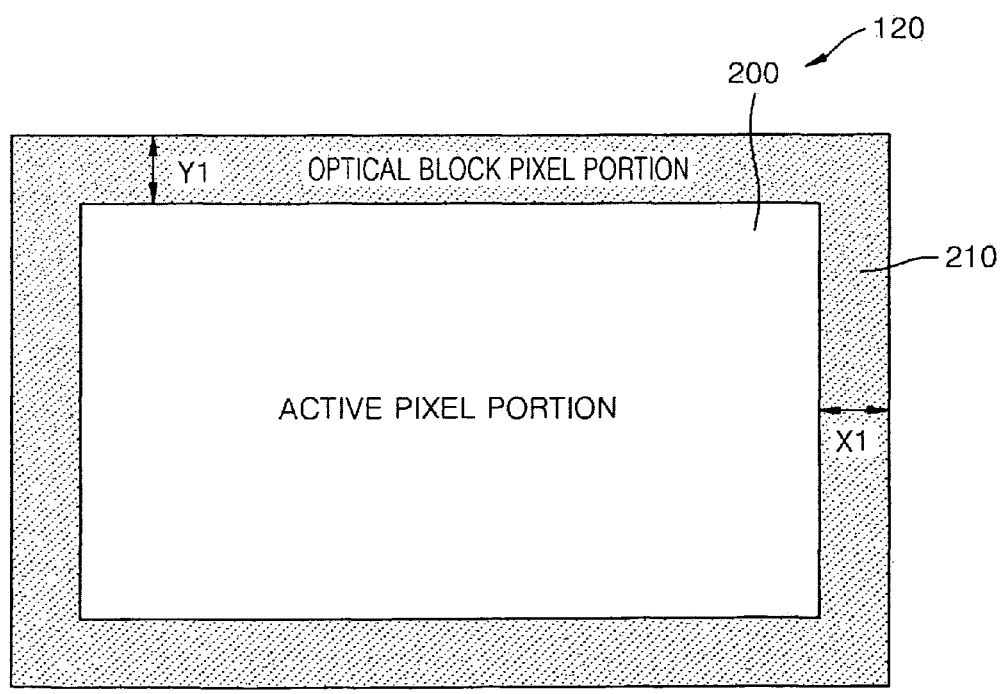

FIG. 4 is a plan view of a pixel array region of a CMOS image sensor according to example embodiments. FIGS. 5 to 10 are plan views illustrating a method of forming a cell array region of a CMOS image sensor and the structure of the CMOS image sensor according to example embodiments.

Referring to FIG. 4, the pixel array region 120 of the CMOS image sensor includes an active pixel portion 200, and an optical block pixel portion 210 which encloses the active pixel portion 200. Each of the active pixel portion 200 and the optical block pixel portion 210 includes a photodiode PD (as shown in FIGS. 5-12) and MOS transistors (not shown).

The active pixel portion 200 senses light during operation of the CMOS image sensor. The optical block pixel portion 210 blocks light. As such, the optical block pixel portion 210 detects and measures an electrical characteristic of the active pixel. The electrical characteristic may be a dark noise characteristic due to a dark current. The measured dark noise characteristic is used to determine a current value that corresponds to the dark current. The optical block pixel portion 210 transmits the current value corresponding to the dark current to the photodiode of the active pixel portion 200 in order to compensate for the dark noise. As such, dark noise may be prevented from occurring in an image device. The horizontal width X1 and the vertical width Y1 of the optical block pixel portion 210 may be determined according to process parameters.

With reference to FIGS. 5 to 10, a method of forming a pixel array region 120 of the CMOS image sensor and the structure of the CMOS image sensor will now be described. In FIGS. 5 to 10, the MOS transistors are omitted from the pixel array region 120 for convenience of explanation. However, the optical block pixel portion 210 is illustrated.

Figure 5:
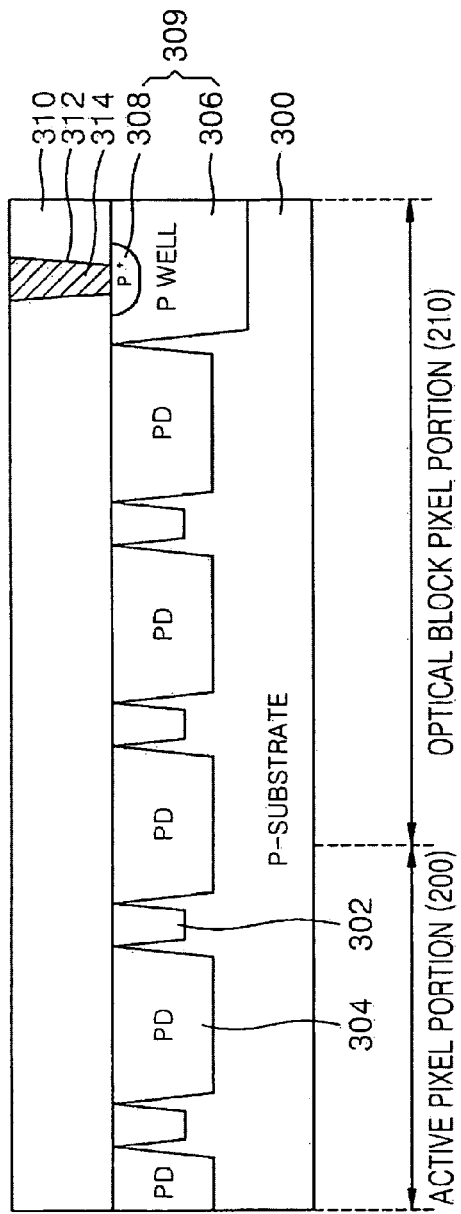

Referring to FIG. 5, a semiconductor substrate 300 (e.g., a p-type silicon substrate) has an isolation layer 302 (e.g., a trench isolation layer) which defines active regions. The isolation layer 302 may be a field insulating layer formed by a Local Oxidation of Silicon (LOCOS) method.

A plurality of photodiodes PD 304 may be formed by implanting impurities into the active region 115a (shown in FIG. 3) in the pixel array region 120 including the active pixel portion 200 and the optical block pixel portion 210 (shown in FIG. 4) on the semiconductor substrate 300. The photodiodes 304 may be formed as a p-n junction region. For example, the photodiodes 304 may be formed by forming a p-type junction region on an n-type junction region.

Photodiodes 304 may be disposed (or formed) on the active pixel portion 200 and the optical block pixel portion 210. The photodiodes 304 on the active pixel portion 200 sense light. The photodiodes 304 disposed on the optical block pixel portion 210 detect a dark noise characteristic of the active pixel portion 200. Although not shown in FIG. 5, an n+ impurity region (not shown) and transistor gate electrodes (not shown) may be formed in the photodiode 304.

As shown in FIG. 4, a p-well 306 may be formed on the optical block pixel portion 210 enclosing the active pixel portion 200. A p+ impurity region 308 may be formed in the p-well by implanting p-type impurities. The p-well 306 and the p-type impurity region 308 form a ground portion 309

(described below) during the formation of an optical block metal pattern (described below) in the optical block pixel portion 210.

In FIG. 5, the isolation layer 302, the photodiodes 304, the p-well 306 and the p+ impurity region 308 may be formed in any desired sequence. That is, example embodiments are not restricted by the order of forming the isolation layer 302, the photodiodes 304, the p-well 306 and the p+ impurity region 308. The p-well 306 and the p+ impurity region 308, which form the ground portion 309, may have any conductive types as long as the p-well 306 and the p+ impurity region 308 operate as the ground portion 309.

A first insulating layer 310 may be formed on the semiconductor substrate 300 on which the photodiode 304 and the p+ impurity region 308 are formed. The first insulating layer 310 may be an oxide layer. After the first insulating layer 310 is formed, a contact hole 312 may be formed to expose the p+ impurity region 308 of the optical block pixel portion 210 using a photo-etching process. A first plug 314 may be buried into the contact hole 312 of the optical block pixel portion 210. The first plug 314 may be electrically connected to the p+ impurity region 308. The first plug 314 may be formed of metal (e.g., tungsten). The first plug 314 may be electrically insulated from the other elements by the first insulating layer 310.

Figure 6:
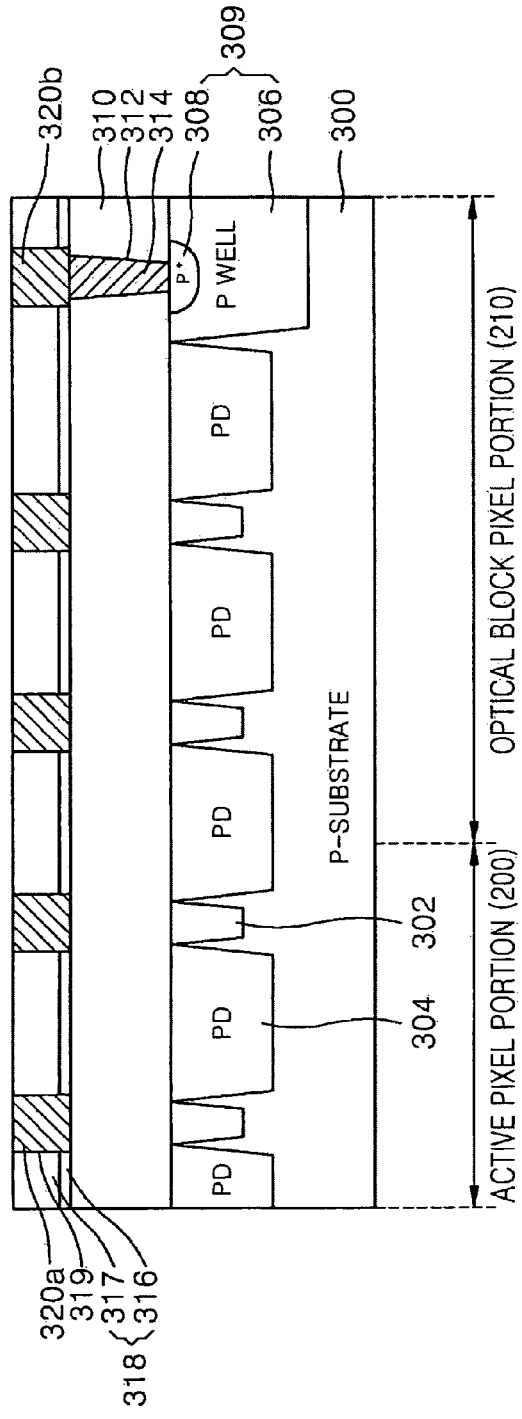

Referring to FIG. 6, a first interlayer insulating layer 318, which includes a first diffusion prevention layer 316 and a second insulating layer 317, may be formed on the first insulating layer 310. The first diffusion prevention layer 316 may be a nitride layer. The second insulating layer 317 may be an oxide layer. A first via hole 319 may be formed by selectively etching the first interlayer insulating layer 318 using a photo-etching process. First metal wires 320a and 320b may be formed in the first via hole 319 using a damascene process. The first metal wires 320a and 320b may be formed of copper. The second insulating layer 317 electrically insulates adjacent (or neighboring) first metal wires 320a and 320b. The first diffusion prevention layer 316 prevent (or reduce) diffusion of metal from the first metal wires 320a and 320b.

According to example embodiments, the first plug 314 of the optical block pixel portion 210 may be exposed during formation of the first via hole 319 by selectively etching the first interlayer insulating layer 318 using the photo-etching process. As such, the first metal wire 320b and the first plug 314 may be electrically connected each other in the optical block pixel portion 210.

Figure 7:
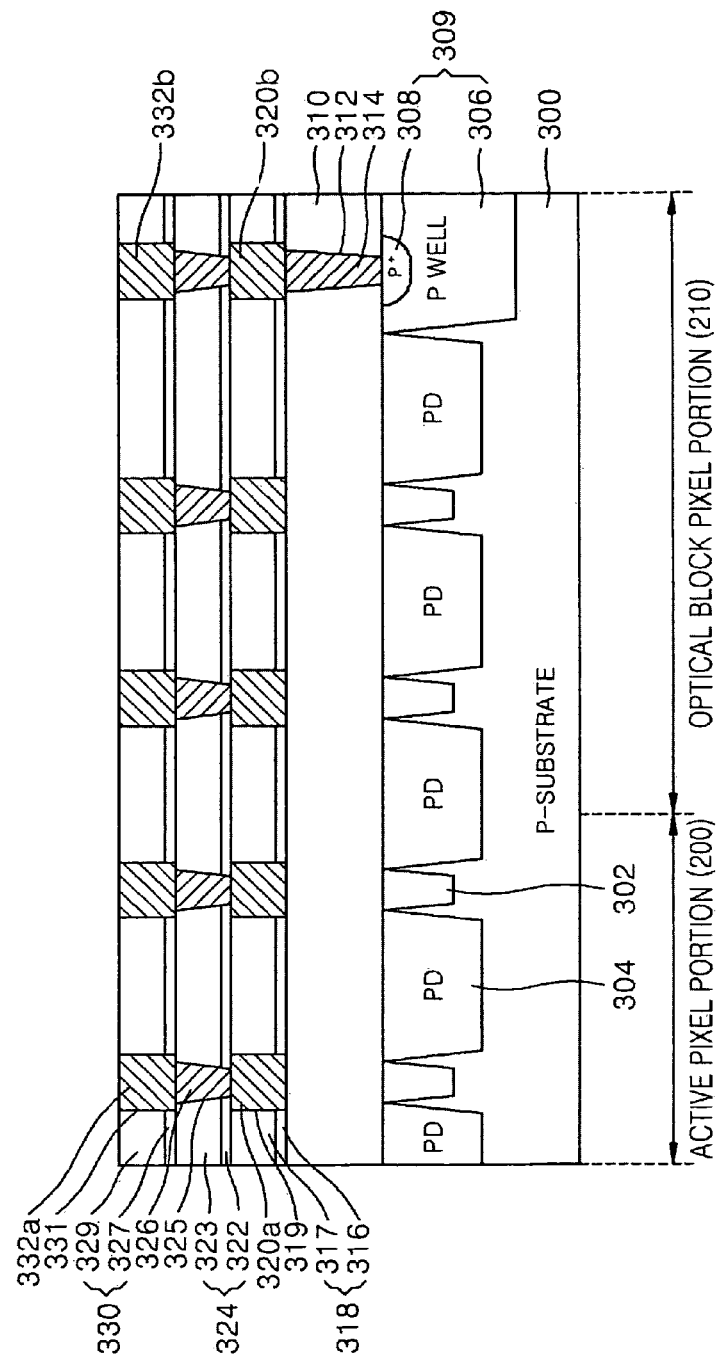

Referring to FIG. 7, a second interlayer insulating layer 324 may be formed on the first metal wires 320a and 320b and the first interlayer insulating layer 318. The second interlayer insulating layer 324 includes a second diffusion prevention layer 322 and a third insulating layer 323. The second diffusion prevention layer 322 and the third insulating layer 323 may be a nitride layer and an oxide layer, respectively. A second via hole 325 may be formed by selectively etching the second interlayer insulating layer 324 using the photo-etching process. A second plug 326 may be buried into the second via hole 325 in each of the active pixel portion 200 and the optical block pixel portion 210. The second plug 326 may be electrically connected to the first metal wires 320a and 320b. The second plug 326 may be formed of metal (e.g., tungsten) similar to the first plug 314.

In example embodiments, if the second via hole 325 is formed by selectively etching the second interlayer insulating layer 324 using the photo-etching process, the first metal wire 320b on the optical block pixel portion 210 may be exposed.

The first metal wire 320b and the second plug 326 may be electrically connected to each other in the optical block pixel portion 210.

A third interlayer insulating layer 330, which includes a third diffusion prevention layer 327 and a fourth insulating layer 329, may be formed on the second plug 326 and the second interlayer insulating layer 324. The third diffusion prevention layer 327 and the fourth insulating layer 329 may be a nitride layer and an oxide layer, respectively. A third via hole 331 may be formed by selectively etching the third interlayer insulating layer 330 using the photo-etching process.

Second metal wires 332a and 332b may be formed in the third via hole 331 in each of the active pixel portion 200 and the optical block pixel portion 210. The second metal wires 332a and 332b may be electrically connected to the second plug 326. The second metal wires 332a and 332b may be formed of copper using a damascene process. The fourth insulating layer 329 electrically insulates the neighboring metal wires 332a and 332b from each other. The third diffusion prevention layer 327 prevents (or reduces) metal diffusion from the second metal wires 332a and 332b.

In example embodiments, the second plug 326 on the optical block pixel portion 210 may be exposed if the third via hole 331 is formed by selectively etching the third interlayer insulating layer 330 using the photo-etching process. As such, the second metal wire 332b and the second plug 326 may be electrically connected to each other in the optical block pixel portion 210.

Figure 8:
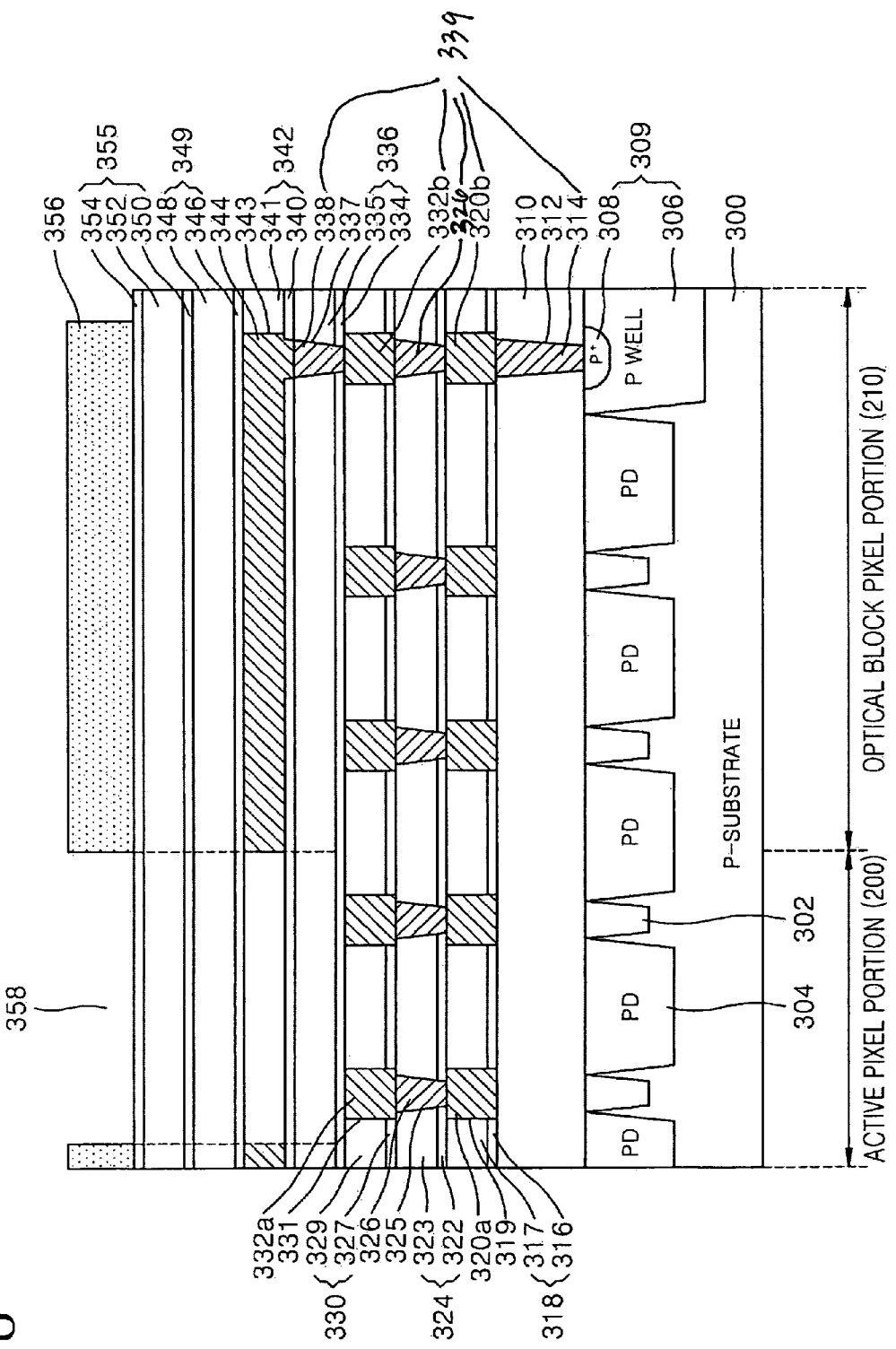

Referring to FIG. 8, a fourth interlayer insulating layer 336 which includes a fourth diffusion prevention layer 334 and a fifth insulating layer 335 may be formed on the second metal wires 332a and 332b and the third interlayer insulating layer 330. The fourth diffusion prevention layer 334 and the fifth insulating layer 335 may be a nitride layer and an oxide layer, respectively. A fourth via hole 337 may be formed to expose the second metal wire 332b on the optical block pixel portion 210 by selectively etching the fourth interlayer insulating layer 336 using the photo-etching process.

A third plug 338 may be buried into the fourth via hole 337 in the optical block pixel portion 210 and electrically connected to the second metal wire 332b. The third plug 338 may be formed of metal (e.g., tungsten) similar to the first plug 314. As such, the second metal wire 332b and the third plug 338 may be electrically connected to each other in the optical block pixel portion 210.

A fifth interlayer insulating layer 342, which includes a fifth diffusion prevention layer 340 and a sixth insulating layer 341, may be formed on the third plug 338 and the fourth interlayer insulating layer 336. A fifth via hole 343 may expose the third plug 338 on the optical block pixel portion 210 by selectively etching the fifth interlayer insulating layer 342 using the photo-etching process.

A third metal wire 344, which is electrically connected to the third plug 338 and functions as an optical block metal pattern, may be formed in the fifth via hole 343 on the optical block pixel portion 210. The third metal wire 344 may be formed of copper using a damascene process. As mentioned above, the third metal wire 344 functions as an optical block metal pattern to prevent light from reaching the optical block pixel portion 210. As such, the optical block pixel portion 210 may detect and measure the dark noise characteristic due to a dark current in the active pixel portion 200. The fifth diffusion prevention layer 340 prevents (or reduces) metal diffusion from the metal wire 344.

The third metal wire 344 may be connected to the ground portion 309 through a connection line 339. The connection line 339 includes the third plug 338, the second metal wire 332b, the second plug 326, the first metal wire 320b and the first plug 314. The third metal wire 344 is connected to the ground portion 309 in order to discharge electrical charges from the third metal wire 344 to the outside through the ground portion 309 and the semiconductor substrate 300 even if the electrical charges accumulate in the third metal wire 344 due to plasma in a subsequent process.

A sixth interlayer insulating layer 349, which includes a sixth diffusion prevention layer 346 and a seventh insulating layer 348, may be formed on the third metal wire 344 and the fifth interlayer insulating layer 342. The sixth diffusion prevention layer 346 and the seventh insulating layer 348 may be a nitride layer and an oxide layer, respectively. A seventh interlayer insulating layer 355, which includes a seventh diffusion prevention layer 350, an eighth insulating layer 352 and an eighth diffusion prevention layer 354, may be formed on the sixth interlayer insulating layer 349. The seventh and eighth diffusion prevention layers 350 and 354 may be nitride layers. The eighth insulating layer 352 may be an oxide layer. A fourth metal wire 356 may be formed on the seventh interlayer insulating layer 355 using a damascene process. The fourth metal wire 356 may be formed of copper. A hole 358 may be formed on the fourth metal wire 356 to expose a part of the seventh interlayer insulating layer 355.

Figure 9:
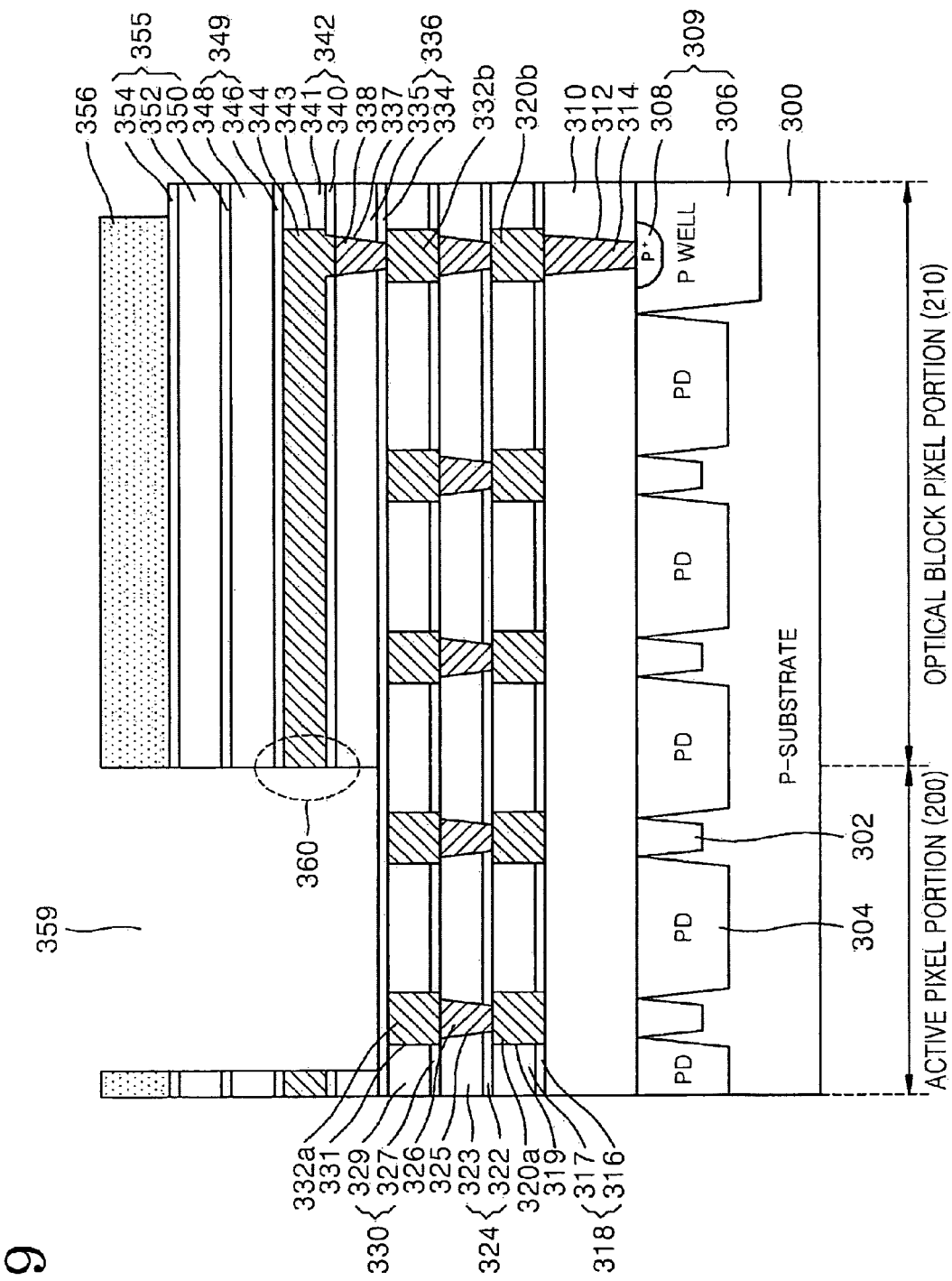

Referring to FIG. 9, a pixel exposure hole 359 may be formed to expose a part of an upper surface of the active portion 200 by sequentially etching the seventh interlayer insulating layer 355, the sixth interlayer insulating layer 349, the fifth interlayer insulating layer 342 and the fourth interlayer insulating layer 336 on the active portion 200 using the fourth metal wire 356 as an etching mask. The pixel exposure hole 359, which exposes the top part of the active portion 200, exposes the fourth diffusion prevention layer 334.

If the pixel exposure hole 359 is formed on the active portion 200, the seventh interlayer insulating layer 355, the sixth interlayer insulating layer 349, the fifth interlayer insulating layer 342 and the fourth interlayer insulating layer 336 may be etched by means of a dry etching processing using plasma. During formation of the pixel exposure hole 359, a gas (e.g., $CF_4/H_2$, $C_2F_6$, $C_3F_8$, and $CHF_3/O_2$) may be used as an etching gas.

If the seventh interlayer insulating layer 355, the sixth interlayer insulating layer 349, the fifth interlayer insulating layer 342 and the fourth interlayer insulating layer 336 are etched, electrical charges accumulate on a side portion 360 of the third metal wire 344 due to damage by plasma, which has electrical charges. The accumulation of the electrical charges may occur regardless of whether or not the side portion 360 is exposed using the dry etching process described above.

The third metal wire 344 is in a floating state. If the third metal wire 344 damaged by the plasma, the damaged third metal wire 344 damages the photodiodes 304 formed on the semiconductor substrate 300. If the photodiodes 304 are damaged, the optical block pixel portion 210 may not able to detect or measure the dark noise characteristics due to the dark current in the active portion 200, as discussed below in detail with reference to FIGS. 11 and 12.

Figure 10:
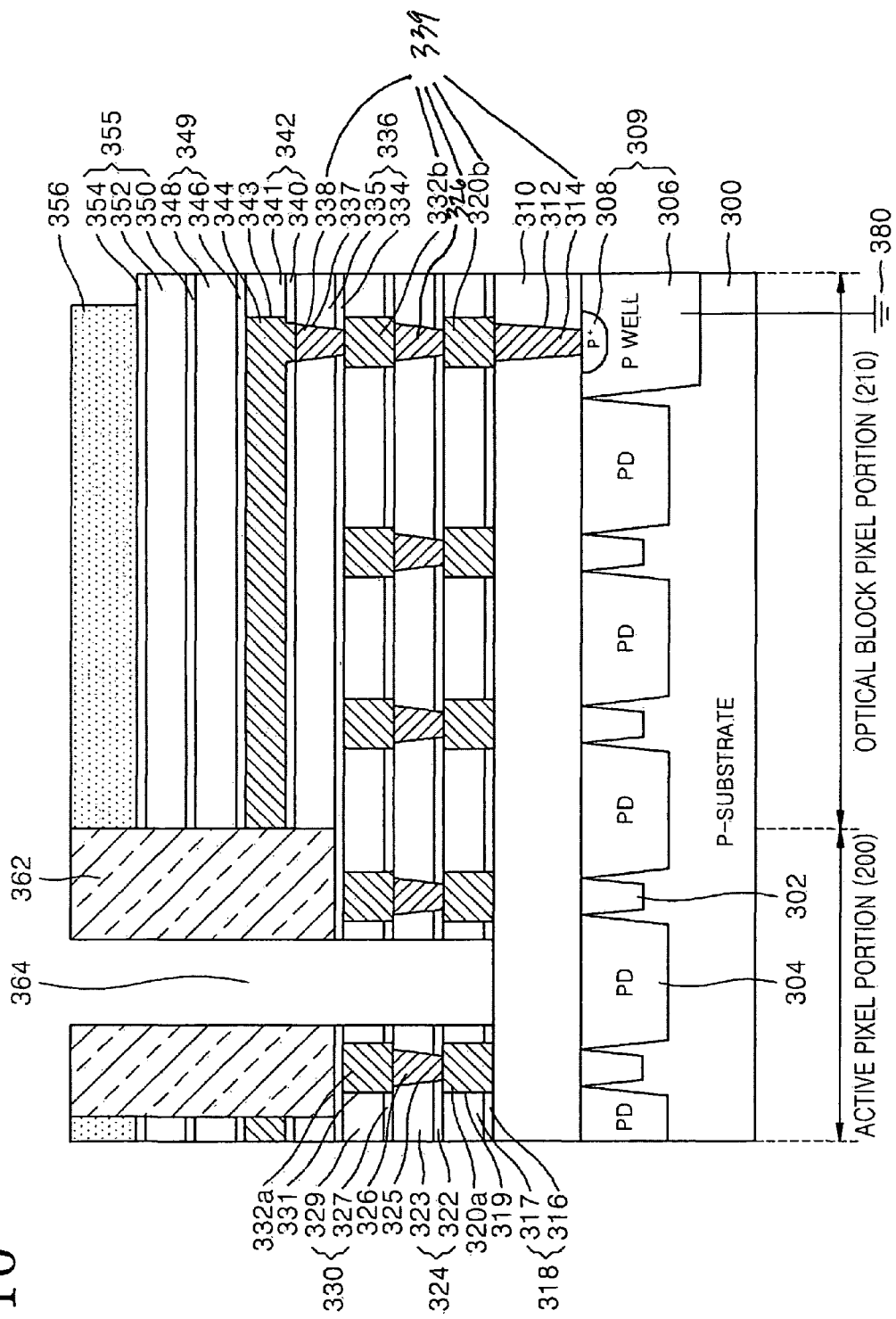

Referring to FIG. 10, a photoresist pattern 362 may be formed on each side of the pixel exposure hole 359 on the active pixel portion 200 using a photo-etching process. A photodiode exposure hole 364 may be formed by sequentially dry-etching third interlayer insulating layer 330, the second interlayer insulating layer 324 and the first interlayer insulating layer 318 using the fourth metal wire 356 and the photoresist pattern 362 as an etching mask. The photodiode exposure hole 364 enables the photodiode PD to more easily sense light by exposing the top surface of the photodiode PD. The photoresist pattern 362 may be removed.

Figure 11:
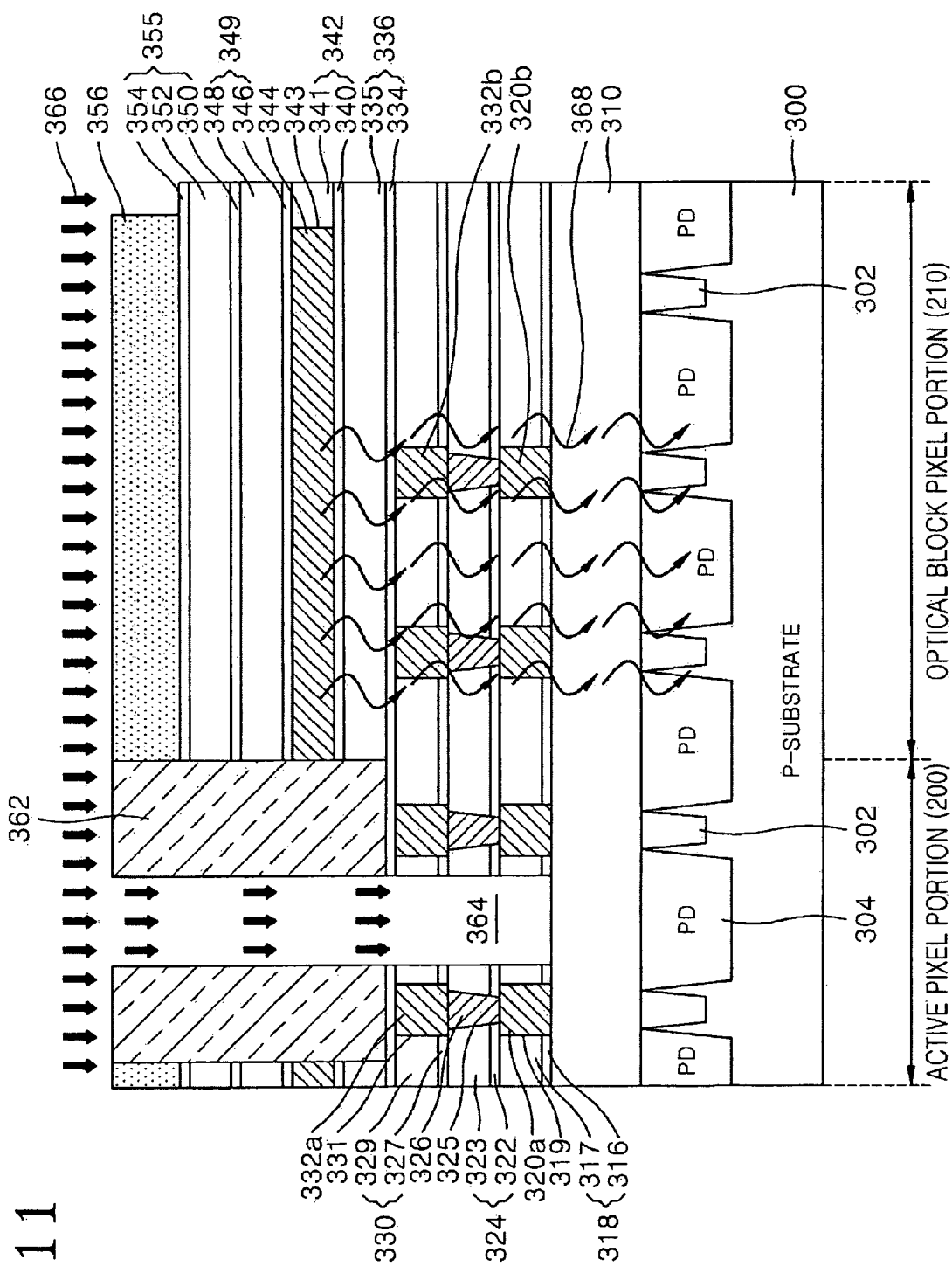

FIG. 11 is a cross-sectional view illustrating how a photodiode PD of the optical block pixel portion is damaged if there is no ground portion during formation of the photodiode exposure hole.

Referring to FIG. 11, the third metal wire 344 is damaged by plasma during formation of the pixel exposure hole 359 shown in FIG. 9. If the third metal wire 344 is damaged, electrical charges included in the third metal wire 344 move downwards as shown by reference numeral 368, damaging the photodiodes 304 on the optical block pixel portion 210 during formation of the photodiode exposure hole 364.

In FIG. 11, because the third metal wire 344 is in a floating state and is damaged by plasma, the electrical charges are accumulated as free electrons and positive ions. The electrical charges move downwardly to the photodiode 304 during the dry-etching process for forming the photodiode exposure hole 364 such that current leakage occurs. If the current leakage occurs in the photodiode 304, the dark noise characteristic of the active pixel portion 200 may not be detected, measured and compensated for. In FIG. 11, reference numeral 366 represents plasma for forming the photodiode exposure hole 364.

Figure 12:
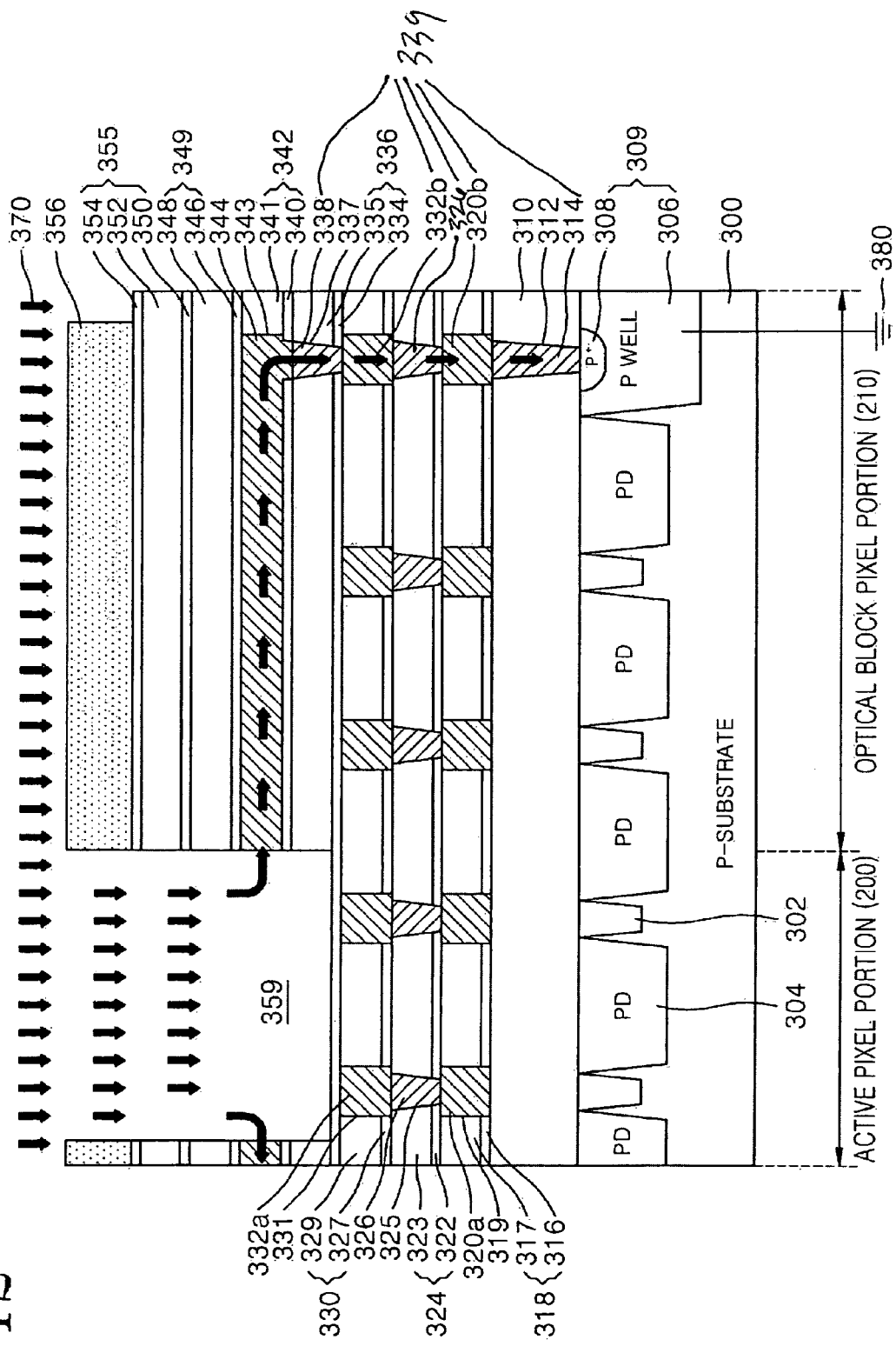

FIG. 12 is a cross-sectional view illustrating how to avoid damaging the third metal wire 344 by plasma upon formation of the pixel exposure hole shown in FIG. 9.

Referring to FIG. 12, the third metal wire 344 may be connected to the connection line 339 and the ground portion 309 such that the electrical charges included in the third metal wire 344 are discharged to the ground 380 through the semiconductor substrate 300. In FIG. 12, reference numeral 370 represents a traveling path of electrical charges included in the plasma when the pixel exposure hole 359 is formed.

Because the third metal wire 344 is connected to the connection line 339 and the ground portion 309, the electrical charges accumulated on the third metal wire 344 due to the damage by the plasma may be discharged to the ground 380 through the semiconductor substrate 300.

The photodiode 304 of the optical block pixel portion 210 may not be damaged. As such, current leakage may not occur. The optical block pixel portion 210 may detect and measure the dark noise characteristic due to the dark current in the active pixel portion 200. Based on the measured result, the photodiode on the active pixel portion 200 may compensate for dark noise by providing a current value that corresponds to the dark current. As such, the occurrence of dark noise in an image device may be prevented (or reduced).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A CMOS image sensor, comprising:
an active pixel portion in a middle region of a semiconductor substrate, wherein the active pixel portion includes at least one photodiode that senses light; and
an optical block pixel portion that encloses the active pixel portion, wherein the optical block pixel portion includes an optical block metal pattern for blocking light and at least one photodiode that detects a dark noise characteristic, wherein the optical block metal pattern is connected to a ground portion, prevents the at least one dark-noise detecting photodiode from sensing light, and is grounded through connection lines formed over an upper portion of the semiconductor substrate.

2. The CMOS image sensor of claim 1, further comprising a pixel array region that includes the active pixel portion and the optical block pixel portion.

3. The CMOS image sensor of claim 1, wherein the optical block pixel portion includes the connection lines electrically connected to the optical block metal pattern, and the ground portion is connected to the connection lines.

4. The CMOS image sensor of claim 1, wherein the connection lines are metal wires and plugs on the semiconductor substrate.

5. The CMOS image sensor of claim 1, wherein the connection lines are grounded through the ground portion, the ground portion being in the semiconductor substrate on the optical block pixel portion.

6. The CMOS image sensor of claim 5, wherein the ground portion includes an impurity region in the semiconductor substrate on the optical block pixel portion and a well that encloses the impurity region.

7. The CMOS image sensor of claim 6, wherein the impurity region is a p+ region, the well is a p+ well and the semiconductor substrate is a p-type semiconductor substrate.

8. A CMOS image sensor, comprising:
an active pixel portion;
an optical block pixel portion that encloses the active pixel portion, the optical block pixel portion including an optical block metal pattern for blocking light, and the optical block metal pattern being connected to a ground portion;
a photodiode on a semiconductor substrate, the semiconductor substrate being defined by the active pixel portion and the optical block pixel portion and the ground portion being on the optical block pixel portion of the semiconductor substrate;
a plug over the ground portion on the optical block pixel portion, the plug being connected to the optical block metal pattern and insulated from the semiconductor substrate on which the photodiode and the ground portion are formed; and
a pixel array region over the optical block pixel portion, the pixel array region including the optical block metal pattern.

9. The CMOS image sensor of claim 8, wherein the optical block metal pattern is on a surface of the photodiode over the optical block pixel portion.

10. The CMOS image sensor of claim 8, further comprising a metal wire on and connected to the plug, the metal wire being insulated by interlayer insulating layers and connected to the optical block metal pattern.

11. The CMOS image sensor of claim 8, wherein the ground portion includes an impurity region in the optical block pixel portion of the semiconductor substrate and a well enclosing the impurity region.

12. The CMOS image sensor of claim 11, wherein the optical block metal pattern over the optical block pixel portion is grounded through the ground portion and the semiconductor substrate.

13. A method of fabricating a CMOS image sensor, the method comprising:
forming a plurality of photodiodes on a semiconductor substrate having an active pixel portion and an optical block pixel portion that encloses the active pixel portion;
forming a ground portion on the optical block pixel portion;
forming an optical block metal pattern for blocking light connected to the ground portion on the optical block pixel portion;
forming a plug over the ground portion on the optical block pixel portion, the plug being connected to the optical block metal pattern and insulated from the semiconductor substrate on which the photodiodes and the ground portion are formed; and
forming a pixel array region over the optical block pixel portion, the pixel array region including the optical block metal pattern.

14. The method of claim 13, wherein the photodiodes on the active pixel portion sense light and the photodiodes on the optical block pixel portion detect a dark noise characteristic.

15. The method of claim 13, wherein forming the ground portion includes forming a well on optical block pixel portion of the semiconductor substrate, and forming an impurity region in the well.

16. The method of claim 13, wherein the optical block metal pattern is connected to the ground portion through connection lines formed on the optical block pixel portion.

17. The method of claim 13, further comprising:
disposing an insulating layer on the plurality of photodiodes and the ground portion on the optical block pixel portion, after forming the ground portion;
forming the plug connected to the ground portion on the optical block pixel portion by selectively etching the insulating layer; and
forming connection lines on the plug and the insulating layer, the connection lines being insulated by an interlayer insulating layer and connected to the plug, prior to forming the optical metal pattern,
the optical block metal pattern being formed on the interlayer insulating layer and the connection lines and connected to the connection lines.

18. The method of claim 15, wherein the impurity region is a p+ region, the well is a p-well, and the semiconductor substrate is a p-type semiconductor substrate.

19. The method of claim 16, wherein the connection lines are metal wires and the plug formed on the optical block pixel portion of the semiconductor substrate.

20. The method of claim 16, further comprising:
forming an interlayer insulating layer on the optical block metal pattern; and
forming a pixel exposure hole that exposes the active pixel portion by dry etching the interlayer insulating layer,
wherein electrical charges are produced due to plasma during formation of the pixel exposure hole, the electrical charges being discharged to the ground portion and the semiconductor substrate through the optical block metal pattern.

21. The method of claim 17, wherein forming the ground portion includes forming a well on the optical block pixel portion of the semiconductor substrate, and forming an impurity region in the well.

22. The method of claim 17, further comprising:
forming a second interlayer insulating layer on the optical block metal pattern and the connection lines; and
forming a pixel exposure hole that exposes the active pixel portion by etching the second interlayer insulating layer,
wherein electrical charges are produced due to plasma during formation of the pixel exposure hole, the electrical charges being discharged to the ground portion and the semiconductor substrate through the optical block metal pattern.

23. The method of claim 17, wherein the connection lines are metal wires and the plug formed on the optical block pixel portion of the semiconductor substrate.

24. The method of claim 21, wherein the impurity region is a p+ region, the well is a p-well, and the semiconductor substrate is a p-type semiconductor substrate.

25. A method of fabricating a CMOS image sensor, comprising:
forming an active pixel portion in a middle region of a semiconductor substrate, wherein the active pixel portion includes at least one photodiode that senses light; and
forming an optical block pixel portion that encloses the active pixel portion, wherein the optical block pixel portion includes an optical block metal pattern for blocking light and at least one photodiode that detects a dark noise characteristic,
wherein the optical block metal pattern is connected to a ground portion, prevents the at least one dark-noise detecting photodiode from sensing light, and is grounded through connection lines formed over an upper portion of the semiconductor substrate.

* * * * *